(12) United States Patent
Kim et al.

(10) Patent No.: US 8,331,171 B2
(45) Date of Patent: Dec. 11, 2012

(54) SEMICONDUCTOR MEMORY APPARATUS

(75) Inventors: Jae Il Kim, Ichon-shi (KR); Jong Chern Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 270 days.

(21) Appl. No.: 12/843,673

(22) Filed: Jul. 26, 2010

(65) Prior Publication Data
US 2011/0188324 A1 Aug. 4, 2011

(30) Foreign Application Priority Data
Jan. 29, 2010 (KR) ........................ 10-2010-0008669

(51) Int. Cl.
G11C 7/10 (2006.01)

(52) U.S. Cl. .......... 365/189.17; 365/189.05; 365/230.03

(58) Field of Classification Search ............. 365/189.17, 365/189.05, 230.05
See application file for complete search history.

(56) References Cited

U.S. PATENT DOCUMENTS

| | | | |
|---|---|---|---|
| 5,771,199 A | 6/1998 | Lee | |
| 6,310,816 B2 | 10/2001 | Manning | |
| 6,414,868 B1 | 7/2002 | Wong et al. | |
| 2004/0032776 A1 | 2/2004 | Kim et al. | |
| 2004/0240302 A1* | 12/2004 | Park | 365/230.06 |
| 2006/0018168 A1 | 1/2006 | Kim | |
| 2009/0273991 A1* | 11/2009 | Song | 365/191 |
| 2010/0008166 A1* | 1/2010 | Kim et al. | 365/189.16 |

FOREIGN PATENT DOCUMENTS

| | | |
|---|---|---|
| JP | 2003-143240 | 5/2003 |
| JP | 2005-056529 | 3/2005 |
| JP | 2005-317124 | 11/2005 |
| KR | 1020010027370 A | 4/2001 |
| KR | 100646980 B1 | 11/2006 |

* cited by examiner

Primary Examiner — Tuan T. Nguyen
(74) Attorney, Agent, or Firm — William Park & Associates Ltd.

(57) ABSTRACT

A semiconductor memory apparatus includes a first data input/output line configured to transmit data from a first memory bank; a second data input/output line configured to transmit the data from the first memory bank; a first data output section configured to align and output data transmitted through the first data input/output line based on an input/output mode; and a second data output section configured to align and output either data transmitted through the first input/output line or the second data input/output line based on the input/output mode and an address signal.

16 Claims, 3 Drawing Sheets

SEMICONDUCTOR MEMORY APPARATUS

CROSS-REFERENCES TO RELATED APPLICATION

The present application claims priority under 35 U.S.C. §119(a) to Korean Application No. 10-2010-0008669, filed on Jan. 29, 2010, in the Korean Intellectual Property Office, which is incorporated herein by reference in its entirety as if set forth in full.

BACKGROUND

1. Technical Field

The present invention relates to semiconductor memory apparatuses, and more particularly, to data input/output of a semiconductor memory apparatus.

2. Related Art

A semiconductor memory apparatus may perform data input/output operations by receiving data through pads from outside the semiconductor memory apparatus and storing the data in memory banks and by outputting the data stored in the memory banks through the pads. These operations are called read/write operations of the semiconductor memory apparatus. The data may be transmitted between the pads and the memory banks through data input/output lines.

FIG. 1 is a diagram schematically illustrating a configuration of a conventional semiconductor memory apparatus. The conventional semiconductor memory apparatus 10 shown in FIG. 1 includes first through eighth memory banks Bank0 through Bank7, a plurality of data input/output lines GIO_0<0:15> through GIO_7<0:15>, and data input/output units 11, 12, and 13. The data input/output units 11, 12, and 13 are connected to pads (not shown). The data input/output units 11, 12, and 13 and the first through eighth memory banks Bank0 through Bank7 may communicate with each other through the data input/output lines GIO_0<0:15> through GIO_7<0:15>. A plurality of the data input/output units 11, 12, and 13 are provided for each memory bank. FIG. 1 illustrates only data alignment circuits Din associated with data input (a write operation) and only pipe latch circuits PIPE associated with data output (a read operation) of the data input/output units 11, 12, and 13 to simplify the description.

During the write operation, the semiconductor memory apparatus 10 may input serial data from outside the semiconductor memory apparatus 10 through the pads, convert the serial data into parallel data through the data alignment circuits Din, which is a part of the data input/output units 11, 12, and 13, transmit the parallel data to corresponding memory banks through the data input/output lines GIO_0<0:15> through GIO_7<0:15>, and store the transmitted data in the corresponding memory banks. During the read operation, the semiconductor memory apparatus 10 may transmit the data stored in the corresponding memory banks to the pipe latch circuits PIPE, which is a part of the data input/output units 11, 12, and 13, through the data input/output lines GIO_0<0:15> through GIO_7<0:15>. The pipe latch circuits PIPE may convert the data transmitted in parallel into serial data, and output the converted data externally through the pads.

As described above, during the write operations and the read operations, the data input/output lines GIO_0<0:15> through GIO_7<0:15> function as data transmission paths. The data input/output lines GIO_0<0:15> through GIO_7<0:15> are disposed in a peripheral region between the memory banks Bank0 through Bank7. As a processing capacity of a semiconductor memory apparatus increases, the number of the data input/output lines GIO_0<0:15> through GIO_7<0: 15> increases. For example, as shown in FIG. 1, in order for the semiconductor memory apparatus 10 to process 16-bit data at a time while performing eight read or write operations continuously, a total of 128 data input/output lines GIO_0<0: 15> through GIO_7<0:15> are needed. Therefore, if the plurality of data input/output lines GIO_0<0:15> through GIO_7<0:15> are disposed in the peripheral region of a limited area as described above, it may be difficult to secure a layout margin of the semiconductor memory apparatus.

SUMMARY

In one embodiment of the present invention, a semiconductor memory apparatus comprises a first data input/output line configured to transmit data from a first memory bank; a second data input/output line configured to transmit the data from the first memory bank; a first data output section configured to align and output data transmitted through the first data input/output line based on an input/output mode; and a second data output section configured to align and output either data transmitted through the first input/output line or the second data input/output line based on the input/output mode and an address signal.

In another embodiment of the present invention, a semiconductor memory apparatus comprises a first data input section configured to align inputted data and output the aligned data to a first data input/output line based on an input/output mode; a second data input section configured to align inputted data and output the aligned data to one of the first data input/output line and a second data input/output line, based on the input/output mode and an address signal; and a first memory bank configured to store the data transmitted through the first and second data input/output lines.

In another embodiment of the present invention, a semiconductor memory apparatus comprises an up bank of a first memory bank and an up bank of a second memory bank; a down bank of the first memory bank and a down bank of the second memory bank; first data input/output lines connected to the up banks of the first and second memory banks; second data input/output lines connected to the down banks of the first and second memory banks; a first data input/output unit configured to communicate with the up banks of the first and second memory banks through the first data input/output lines; and a second data input/output unit configured to communicate with the up banks and the down banks of the first and second memory banks through the first and second data input/output lines.

BRIEF DESCRIPTION OF THE DRAWINGS

Features, aspects, and embodiments are described in conjunction with the attached drawings, in which.

DETAILED DESCRIPTION

Figure 1:
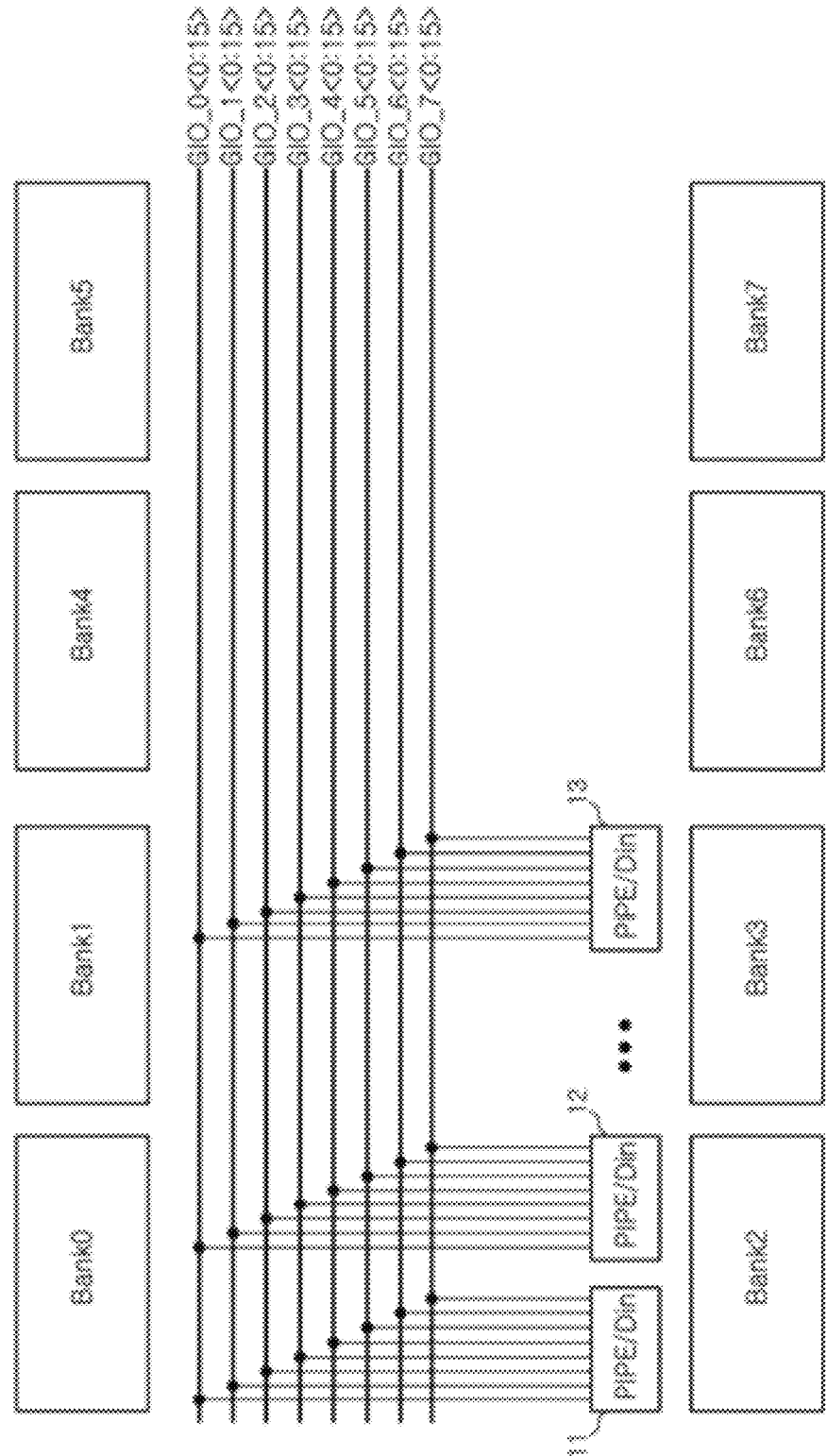
FIG. 1 is a diagram schematically illustrating a configuration of a conventional semiconductor memory apparatus.

Reference will now be made in detail to the exemplary embodiments consistent with the present disclosure, examples of which are illustrated in the accompanying drawings. Whenever possible, the same reference numerals will be used throughout the drawings to refer to the same or like parts.

Figure 2:
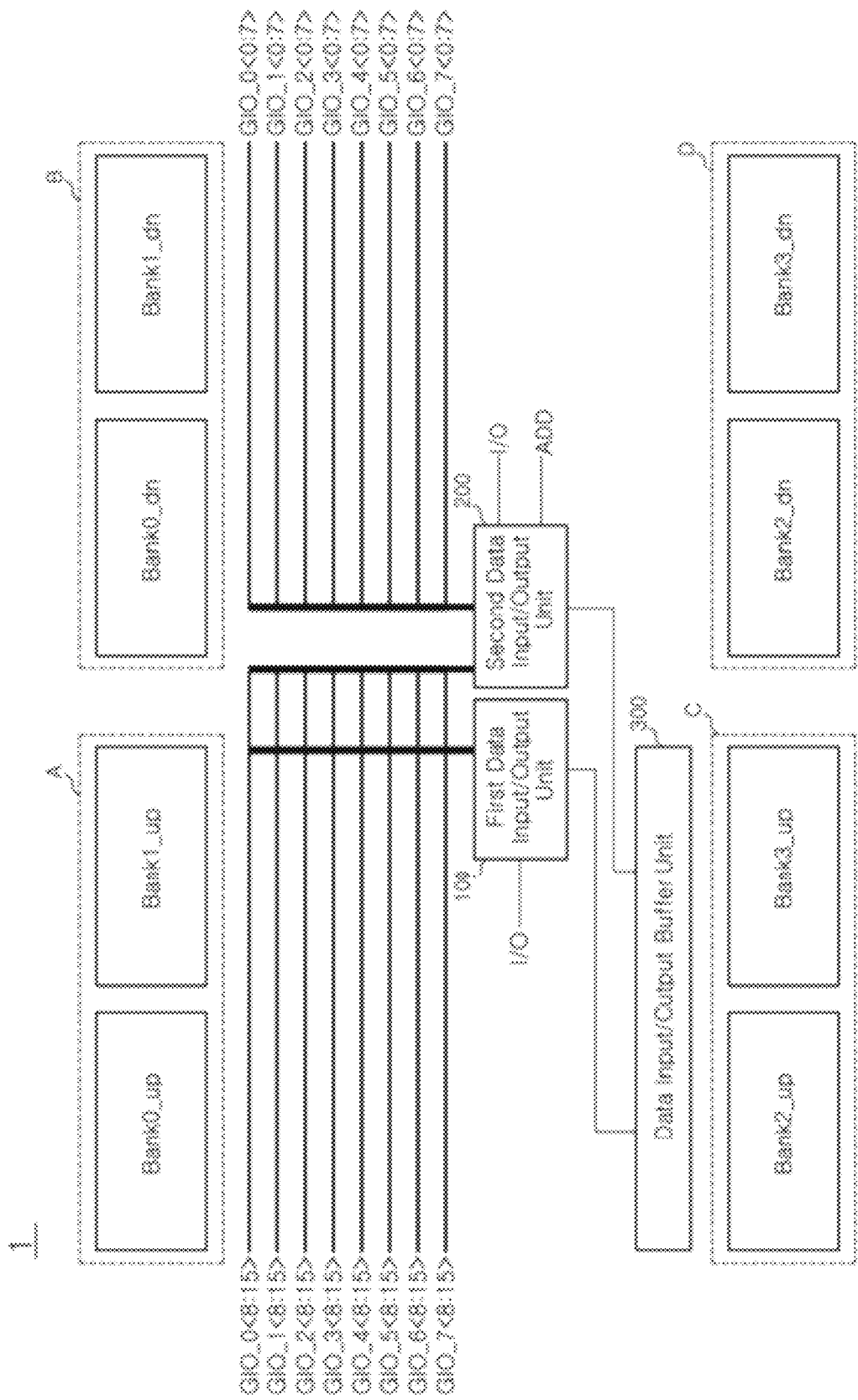
FIG. 2 is a diagram illustrating an exemplary configuration of a semiconductor memory apparatus in accordance with one embodiment of the invention.

FIG. 2 is a diagram schematically illustrating a configuration of a semiconductor memory apparatus 1 in accordance with one embodiment of the present invention. The semiconductor memory apparatus 1 may include first through fourth memory banks Bank0 through Bank3. The first through fourth memory banks Bank0 through Bank3 are respectively divided into up banks Bank0_up through Bank3_up and down banks Bank0_dn through Bank3_dn. The up banks Bank0_up through Bank3_up and the down banks Bank0_dn through Bank3_dn are disposed in different regions respectively. The up bank Bank0_up of the first memory bank and the up bank Bank0_up of the second memory bank may be disposed in a first bank region A, and the down bank Bank0_dn of the first memory bank and the down bank Bank1_dn of the second memory bank may be disposed in a second bank region B. The up bank Bank2_up of the third memory bank and the up bank Bank3_up of the fourth memory bank may be disposed in a third bank region C. The down bank Bank2_dn of the third memory bank and the down bank Bank3_dn of the fourth memory bank may be disposed in a fourth bank region D. In FIG. 2, the first and third bank regions A and C are arranged on the left, whereas the second and fourth bank regions B and D are arranged on the right.

The semiconductor memory apparatus 1 shown in FIG. 2 further includes first data input/output lines GIO_0<8:15> through GIO_7<8:15>, second data input/output lines GIO_0<0:7> through GIO_7<0:7>, a first data input/output unit 100, and a second data input/output unit 200. The first data input/output lines GIO_0<8:15> through GIO_7<8:15> are connected to the up banks Bank0_up through Bank3_up of the first through fourth memory banks. That is, the first data input/output lines GIO_0<8:15> through GIO_7<8:15> are disposed to extend leftward when viewed from the first and second data input/output units 100 and 200. The second data input/output lines GIO_0<0:7> through GIO_7<0:7> are connected to the down banks Bank0_dn through Bank3_dn of the first through fourth memory banks. That is, the second data input/output lines GIO_0<0:7> through GIO_7<0:7> are disposed to extend rightward when viewed from the first and second data input/output units 100 and 200.

The first data input/output unit 100 is connected to the first data input/output lines GIO_0<8:15> through GIO_7<8:15>. During a read operation, the semiconductor memory apparatus 1 transmits the data stored in the up banks Bank0_up through Bank3_up of the first through fourth memory banks to the first data input/output unit 100 through the first data input/output lines GIO_0<8:15> through GIO_7<8:15> that are aligned. During a write operation, the semiconductor memory apparatus 1 may align inputted data through the first data input/output unit 100 and transmit the aligned data to the up banks Bank0_up through Bank3_up of the first through fourth memory banks through the first data input/output lines GIO_0<8:15> through GIO_7<8:15>. Accordingly, the first data input/output unit 100 may communicate with the up banks Bank0_up through Bank3_up of the first through fourth memory banks through the first data input/output lines GIO_0<8:15> through GIO_7<8:15>.

The first data input/output unit 100 is selectively connected to the first data input/output lines GIO_0<8:15> through GIO_7<8:15> based on an input/output mode. Therefore, the first data input/output unit 100 may selectively communicate with the up banks Bank0_up through Bank3_up of the first through fourth memory banks based on the input/output mode. For example, the first data input/output unit 100 is not connected to the first data input/output lines GIO_0<8:15> through GIO_7<8:15> in a first input/output mode, and is connected to the first data input/output lines GIO_0<8:15> through GIO_7<8:15> in a second input/output mode. In such case, the first data input/output unit 100 may be deactivated in the first input/output mode.

The second data input/output unit 200 is connected to the first data input/output lines GIO_0<8:15> through GIO_7<8:15> and the second data input/output lines GIO_0<0:7> through GIO_7<0:7>. The second data input/output unit 200 may selectively communicate with either the first or second data input/output lines GIO_0<8:15> through GIO_7<8:15> or GIO_0<0:7> through GIO_7<0:7> based on, e.g., the input/output mode and an address signal ADD. The second data input/output unit 200 may communicate with either the first or second data input/output lines GIO_0<8:15> through GIO_7<8:15> or GIO_0<0:7> through GIO_7<0:7> in response to the address signal ADD in the first input/output mode, and communicate with the second data input/output lines GIO_0<0:7> through GIO_7<0:7> in the second input/output mode. In the first input/output mode, the second data input/output unit 200 is connected to either the first or second data input/output lines GIO_0<8:15> through GIO_7<8:15> or GIO_0<0:7> through GIO_7<0:7> in response to the address signal ADD during a read operation, and may align and output the data transmitted from the connected data input/output lines. In the first input/output mode, the second data input/output unit 200 may align inputted data during a write operation, and transmit the aligned data to either the first or second data input/output lines GIO_0<8:15> through GIO_7<8:15> or GIO_0<0:7> through GIO_7<0:7> in response to the address signal ADD. In the second input/output mode, the second data input/output unit 200 may align and output the data transmitted through the second data input/output lines GIO_0<0:7> through GIO_7<0:7> during a read operation. During a write operation in the second input/output mode, the second data input/output unit 200 may align inputted data and output the aligned data to the second data input/output lines GIO_0<0:7> through GIO_7<0:7> during a write operation. Accordingly, the second data input/output unit 200 may selectively communicate with either the up banks Bank0_up through Bank3_up of the first through fourth memory banks or the down banks Bank0_dn through Bank3_dn of the first through fourth memory banks based on the address signal ADD in the first input/output mode, and may communicate with the down banks Bank0_dn through Bank3_dn of the first through fourth memory banks in the second input/output mode.

The first and second input/output modes may be determined by an input/output mode signal I/O. The input/output mode signal I/O is a signal which may determine the number of data capable of being inputted and outputted at a time by the semiconductor memory apparatus 1. For example, X4, X8 and X16 signals may be used as the input/output mode signal I/O. The X4 signal may indicate an input/output mode in which 4-bit data can be inputted and outputted at a time, the X8 signal may indicate an input/output mode in which 8-bit data can be inputted and outputted at a time, and the X16 signal may indicate an input/output mode in which 16-bit data can be inputted and outputted at a time. The input/output mode signal I/O can be generated in the mode register set of a semiconductor memory apparatus. In the embodiment of the present invention, the first input/output mode may be the input/output mode which is indicated by the X8 signal, and the second input/output mode may be the input/output mode which is indicated by the X16 signal, although the present invention is not limited thereto. As the address signal ADD, one of row address signals which are generally used to select rows of a semiconductor memory apparatus can be utilized.

In the semiconductor memory apparatus 1, the first through fourth memory banks Bank0 through Bank3 may be disposed in the first through fourth bank regions A through D through division into the up banks Bank0_up through Bank3_up and the down banks Bank0_dn through Bank3_dn. The first through fourth bank regions A through D may be arranged on the left and right. The first and second data input/output units 100 and 200 may be disposed between the first through fourth bank regions A through D, that is, in the center portion of a peripheral region. The up banks Bank0_up through Bank3_up of the first through fourth memory banks, which may be disposed on the left, may be connected to the first data input/output unit 100 through the first data input/output lines GIO_0<8:15> through GID_7<8:15>. Further, the down banks Bank0_dn through Bank3_dn of the first through fourth memory banks which may be disposed right may be connected to the second data input/output unit 200 through the second data input/output lines GIO_0<0:7> through GIO_7<0:7>. In the conventional art, 128 data input/output lines may be disposed for one memory bank. Although only 64 data input/output lines are disposed for one memory bank in the above-described structure, the data input/output operations of the semiconductor memory apparatus 1 may be performed in the same manner in the conventional art.

The semiconductor memory apparatus 1 illustrated in FIG. 2 may also include a data input/output buffer unit 300. The data input/output buffer unit 300 may buffer the data outputted from the first and second data input/output units 100 and 200 and outputs the buffered data to a pad during a read operation. The data input/output buffer unit 300 may buffer external data inputted through the pad and transmits the buffered data to the first and second input/output units 100 and 200 during a write operation. Unlike the first and second data input/output units 100 and 200, the data input/output buffer unit 300 may be disposed adjacent to the bank regions A through D. In other words, the data input/output buffer unit 300 may be disposed at a position where the pad is positioned, in the same manner as the conventional art.

Figure 3:
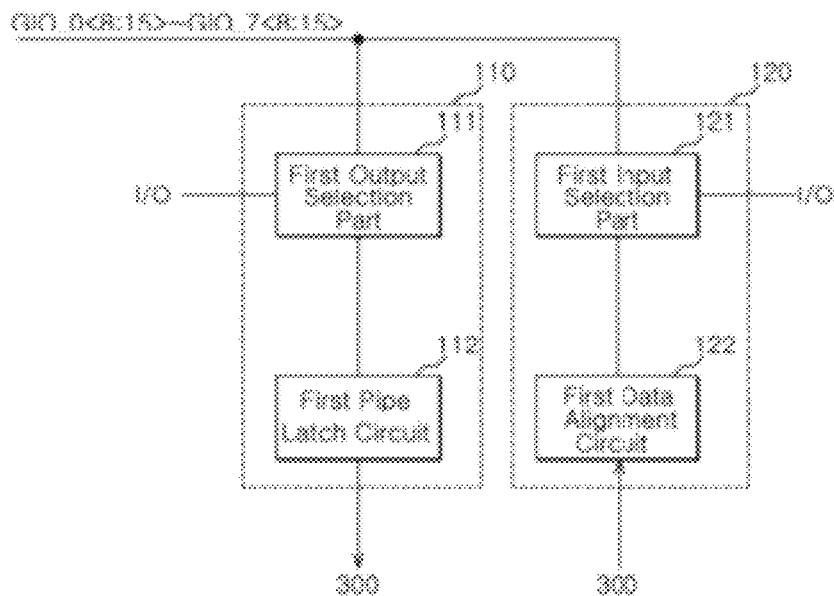
FIG. 3 is a block diagram schematically illustrating a configuration of a first data input/output unit shown in FIG. 2.

FIG. 3 is a block diagram illustrating a configuration of the first data input/output unit 100 shown in FIG. 2. Referring to FIG. 3, the first data input/output unit 100 may include a first data output section 110 and a first data input section 120. The first data output section 110 and the first data input section 120 are selectively connected to the first data input/output lines GIO_0<8:15> through GIO_7<8:15> based on the input/output mode. The first data output section 110 and the first data input section 120 are not connected to the first data input/output lines GIO_0<8:15> through GIO_7<8:15> in the first input/output mode which is determined by the input/output mode signal I/O. The first data output section 110 and the first data input section 120 are connected to the first data input/output lines GIO_0<8:15> through GIO_7<8:15> in the second input/output mode. Whether the input/output mode is the first input/output mode or the second input/output mode may be determined based on the input/output mode signal I/O.

The first data output section 110 may include a first output selection part 111 and a first pipe latch circuit 112. The first output selection part 111 may output the data transmitted through the first data input/output lines GIO_0<8:15> through GIO_7<8:15> based on the input/output mode. The first pipe latch circuit 112 may align the data outputted from the first output selection part 111 and output the aligned data to the data input/output buffer unit 300. Accordingly, the first data output section 110 may be a circuit which is associated with the read operation of the semiconductor memory apparatus 1. The first output selection part 111 may be implemented as a multiplexer that has the input/output mode signal I/O as a control signal, and the first pipe latch circuit 112 may be configured in a way generally known in the art.

The first data input section 120 may include a first input selection part 121 and a first data alignment circuit 122. The first input selection part 121 may be selectively connected to the first data input/output lines GIO_0<8:15> through GIO_7<8:15> based on the input/output mode. The first data alignment circuit 122 may align the data inputted from the data input/output buffer unit 300 and outputs the aligned data to the first input selection part 121. Accordingly, the first data input section 120 may be a circuit which is associated with the write operation of the semiconductor memory apparatus 1. The first input selection part 121 may be implemented as a multiplexer that has the input/output mode signal I/O as a control signal, and the first data alignment circuit 122 may be configured in a way generally known in the art.

In the above-described configuration, the first data input/output unit 100 may be selectively connected to the first data input/output lines GIO_0<8:15> through GIO_7<8:15> based on the input/output mode, and may communicate with the up banks Bank0_up through Bank3_up of the first through fourth memory banks. That is, the first data input/output unit 100 may perform the read/write operations of the up banks Bank0_up through Bank3_up of the first through fourth memory banks.

Figure 4:
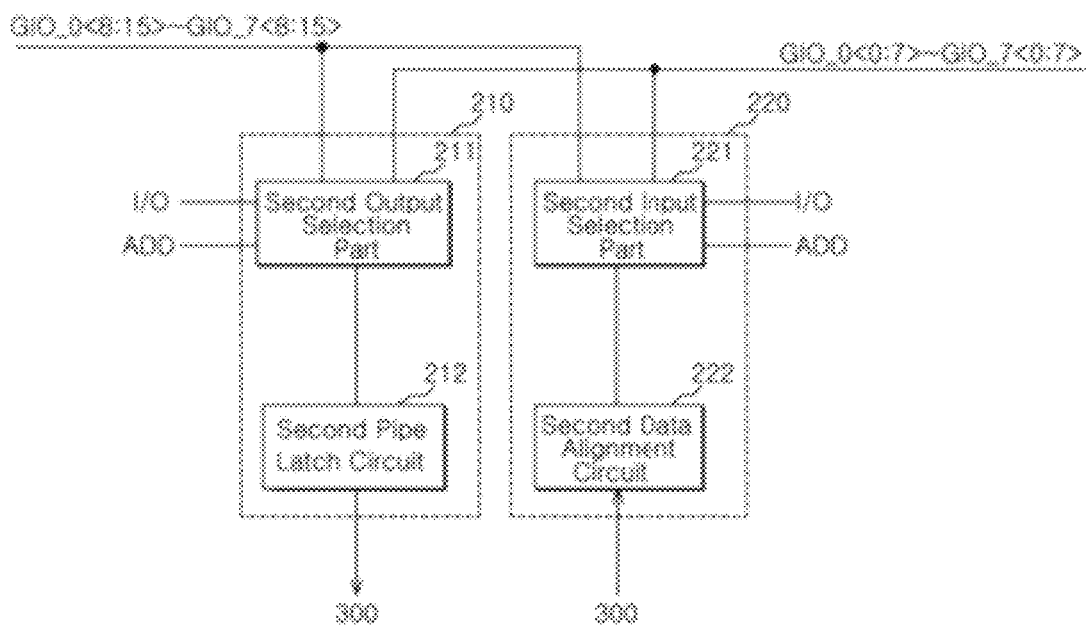
FIG. 4 is a block diagram schematically illustrating a configuration of a second data input/output unit shown in FIG. 2.

FIG. 4 is a block diagram illustrating the configuration of the second data input/output unit 200 shown in FIG. 2. Referring to FIG. 4, the second data input/output unit 200 may include a second data output section 210 and a second data input section 220. The second data output section 210 and the second data input section 220 are connected to either the first or second data input/output lines GIO_0<8:15> through GIO_7<8:15> or GIO_0<0:7> through GIO_7<0:7> based on the input/output mode and the address signal ADD.

The second data output section 210 may include a second output selection part 211 and a second pipe latch circuit 212. The second data input section 220 may include a second input selection part 221 and a second data alignment circuit 222. Accordingly, the second data output section 210 may be a circuit which is associated with the read operation of the semiconductor memory apparatus 1, and the second data input section 220 may be a circuit which is associated with the write operation of the semiconductor memory apparatus 1. The second output selection part 211 and the second input selection part 221 may be respectively implemented as multiplexers which have the input/output mode signal I/O and the address signal ADD as control signals, and the second pipe latch circuit 212 and the second data alignment circuit 222 may be configured in a way generally known in the art.

The second data input/output unit 200 may perform the read operation. The second output selection part 211 may be connected to either the first or second data input/output lines GIO_0<8:15> through GIO_7<8:15> or GIO_0<0:7> through GIO_7<0:7> based on the input/output mode and the address signal ADD. In the first input/output mode which is determined by the input/output mode signal I/O, the second output selection part 211 may output the data transmitted from either the first and second data input/output lines GIO_0<8:15> through GIO_7<8:15> or GIO_0<0:7> through GIO_7<0:7>, based on the address signal ADD. In the second input/output mode, the second output selection part 211 may output the data transmitted from the second data input/output lines GIO_0<0:7> through GIO_7<0:7>, regardless of the address signal ADD. The data outputted through the second output selection part 211 may be aligned by the second pipe latch circuit 212, and the aligned data are outputted to the data input/output buffer unit 300. As stated above, whether the input/output mode is the first input/output mode or the second input/output mode may be determined based on the input/output mode signal I/O.

The second data input/output unit 200 may also perform the write operation. The data inputted through the data input/output buffer unit 300 may be aligned by the second data alignment circuit 222 and inputted to the second input selection part 221. The second input selection part 221 may be connected to either the first or second data input/output lines GIO_0<8:15> through GIO_7<8:15> or GIO_0<0:7> through GIO_7<0:7> based on the input/output mode and the address signal ADD. In the first input/output mode, the second input selection part 221 may be selectively connected to the first and second data input/output lines GIO_0<8:15> through GIO_7<8:15> and GIO_0<0:7> through GIO_7<0:7> based on the address signal ADD. For example, when the address signal has a high level, the second input selection part 221 may be connected to the first data input/output lines GIO_0<8:15> through GIO_7<8:15>, and the data aligned by the second data alignment part 222 may be transmitted to the up banks Bank0_up through Bank3_up of the first through fourth memory banks through the first data input/output lines GIO_0<8:15> through GIO_7<8:15>. Conversely, when the address signal ADD has a low level, the second input selection part 221 is connected to the second data input/output lines GIO_0<0:7> through GIO_7<0:7>, and the data aligned by the second data alignment part 222 may be transmitted to the down banks Bank0_dn through Bank3_dn of the first through fourth memory banks through the second data input/output lines GIO_0<0:7> through GIO_7<0:7>. In the second input/output mode, the second input selection part 221 transmits the data aligned by the second data alignment part 222 to the second data input/output lines GIO_0<0:7> through GIO_7<0:7> regardless of the address signal ADD.

Detailed operations of the semiconductor memory apparatus 1 in accordance with an embodiment of the present invention will be described with reference to FIGS. 2 through 4. The read operation of the semiconductor memory apparatus 1 in the first input/output mode is first described below. The address signal ADD may become a high level when the read operation of the up bank Bank0_up of the first memory bank is performed. The first data input/output unit 100 may be deactivated, and the second output selection part 211 of the second data output section 210 is connected to the first data input/output lines GIO_0<8:15> through GIO_7<8:15>. The data stored in the up bank Bank0_up of the first memory bank are transmitted to the first data input/output lines GIO_0<8:15> through GIO_7<8:15>. The data transmitted to the first data input/output lines GIO_0<8:15> through GIO_7<8:15> are inputted to the second pipe latch circuit 212 through the second output selection part 211. The pipe latch circuit 212 aligns the data inputted in parallel and outputs the data aligned in series. The data input/output buffer unit 300 buffers the aligned serial data, and the buffered data may be outputted to the outside through the pad. In the case where the read operation of the down bank Bank0_dn of the first memory bank is performed, the address signal ADD becomes a low level. Since the second output selection part 211 is connected to the second data input/output lines GIO_0<0:7> through GIO_7<0:7>, the data stored in the down bank Bank0_dn of the first memory bank are inputted to the second pipe latch circuit 212. Therefore, the data stored in the down bank Bank0_dn of the first memory bank may be outputted through the second pipe latch circuit 212 and the data input/output buffer unit 300. Accordingly, because the bit number of the data inputted and outputted in the first input/output mode belongs to one half of the bit number of the data inputted and outputted in the second input/output mode, the read/write operations of the semiconductor memory apparatus 1 are performed through the second data input/output unit 200 in the first input/output mode.

The address signal ADD may become a low level when the write operation of the up bank Bank0_up of the first memory bank is performed The data inputted through the pad and the data input/output buffer unit 300 from the outside are inputted to the second data alignment circuit 222 of the second data input/output unit 200 and are then aligned. The aligned data are inputted to the second input selection part 221 of the second data input section 220. At this time, since the address signal ADD has a high level, the second input selection part 221 is connected to the first data input/output lines GIO_0<8:15> through GIO_7<8:15>, and the aligned data are transmitted to the up bank Bank0_up of the first memory bank through the first data input/output lines GIO_0<8:15> through GIO_7<8:15> and are stored in the up bank Bank0_up of the first memory bank.

When the write operation of the down bank Bank0_dn of the first memory bank is performed, the address signal ADD becomes a low level. The second input selection part 221 is connected to the second data input/output lines GIO_0<0:7> through GIO_7<0:7>, and the data aligned by the second data alignment circuit 222 are transmitted to the down bank Bank0_dn of the first memory bank through the second data input/output lines GIO_0<0:7> through GIO_7<0:7> and may be stored in the down bank Bank0_dn of the first memory bank.

In the second input/output mode, the first output selection part 111 and the first input selection part 121 of the first data input/output unit 100 are connected to the first data input/output lines GIO_0<8:15> through GIO_7<8:15>, and the second output selection part 211 and the second input selection part 221 of the second data input/output unit 200 are connected to the second data input/output lines GIO_0<0:7> through GIO_7<0:7> regardless of the address signal ADD.

During the read operation, the data stored in the up bank Bank0_up of the first memory bank may be transmitted to the first data input/output lines GIO_0<8:15> through GIO_7<8:15>, and the data stored in the down bank Bank0_dn of the first memory bank may be transmitted to the second data input/output lines GIO_0<0:7> through GIO_7<0:7>. The first output selection part 111 of the first data output section 110 may output the data transmitted through the first data input/output lines GIO_0<8:15> through GIO_7<8:15> to the first pipe latch circuit 112, and the second output selection part 211 of the second data output section 210 may output the data transmitted through the second data input/output lines GIO_0<0:7> through GIO_7<0:7> to the second pipe latch circuit 212. The first and second pipe latch circuits 112 and 212 align the data outputted from the first and second output selection parts 111 and 211 and output the aligned data to the data input/output buffer unit 300. The data input/output buffer unit 300 buffers the aligned data and outputs the buffered data through the pad. In this way, the read operations of the up bank and the down bank Bank0_up and Bank0_dn of the first memory bank may be performed. The read operations of the second through fourth memory banks Bank1 through Bank3 may be performed in the same manner.

During the write operation, the external data inputted through the pad and the data input/output buffer unit 300 are inputted to the first and second data alignment circuits 122 and 222. The first and second data alignment circuits 122 and 222 align the inputted data and output the aligned data to the first and second input selection parts 121 and 221. Since the first input selection part 121 is connected to the first data input/output lines GIO_0<8:15> through GIO_7<8:15>, the data aligned by the first data alignment circuit 122 are transmitted through the first data input/output lines GIO_0<8:15> through GIO_7<8:15> and may be stored in the up bank Bank0_up of the first memory bank. Since the second input selection part 221 is connected to the second data input/output lines GIO_0<0:7> through GIO_7<0:7>, the data aligned by the second data alignment circuit 222 are transmitted through the second data input/output lines GIO_0<0:7> through GIO_7<0:7> and may be stored in the down bank Bank0_dn of the first memory bank. In this way, the write operations of the up bank and the down bank Bank0_up and Bank0_dn of the first memory bank may be performed. The write operations of the second through fourth memory banks Bank1 through Bank3 may be performed in the same manner.

As is apparent from the above description, in the present invention, since memory banks are divisionally disposed into up banks and down banks and data input/output units for performing data input/output operations are disposed in the center portion of a peripheral region, the number of data input/output lines may be decreased when compared to the conventional art. Accordingly, a layout margin of a semiconductor memory apparatus may be improved. Also, a data input/output structure capable of selectively utilizing a decreased number of data input/output lines based on an input/output mode is provided.

While certain embodiments have been described above with reference to illustrative examples for particular applications, it will be understood to those skilled in the art that the embodiment described is by way of example only. Those skilled in the art with access to the teachings provided in this disclosure will recognize additional modifications, applications, and/or embodiments and additional fields in which the present disclosure would be of significant utility. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a first data input/output line configured to transmit data from a first memory bank;
   a second data input/output line configured to transmit the data from the first memory bank;
   a first data output section configured to align and output data transmitted through the first data input/output line based on an input/output mode; and
   a second data output section configured to align and output either data transmitted through the first input/output line or the second data input/output line based on the input/output mode and an address signal.

2. The semiconductor memory apparatus according to claim 1, wherein the first data output section is deactivated in a first input/output mode, and aligns and outputs the data transmitted through the first data input/output line in a second input/output mode.

3. The semiconductor memory apparatus according to claim 2, wherein the second data output section aligns and outputs the data transmitted through the second data input/output line in the first input/output mode, and aligns and outputs the data transmitted through either the first data input/output line or the second data input/output line based on the address signal in the second input/output mode.

4. The semiconductor memory apparatus according to claim 1, wherein the first data output section comprises:
   a first output selection part configured to be selectively connected to the first data input/output line based on the input/output mode; and
   a first pipe latch circuit configured to align data outputted from the first output selection part.

5. The semiconductor memory apparatus according to claim 4, wherein the second data output section comprises:
   a second output selection part configured to be selectively connected to the first and second data input/output lines based on the input/output mode and the address signal; and
   a second pipe latch circuit configured to align data outputted from the second output selection part.

6. The semiconductor memory apparatus according to claim 1, wherein the first data output section aligns the data transmitted in parallel through the first data input/output line into serial data and outputs the aligned serial data.

7. The semiconductor memory apparatus according to claim 1, wherein the second data output section aligns the data transmitted in parallel through the first and second data input/output lines into serial data and outputs the aligned serial data.

8. The semiconductor memory apparatus according to claim 1, further comprising:
   a data output buffer unit configured to buffer data outputted from the first and second data output sections and output the buffered data to a pad.

9. A semiconductor memory apparatus comprising:
   a first data input section configured to align inputted data and output the aligned data to a first data input/output line based on an input/output mode;
   a second data input section configured to align inputted data and output the aligned data to one of the first data input/output line and a second data input/output line, based on the input/output mode and an address signal; and
   a first memory bank configured to store the data transmitted through the first and second data input/output lines.

10. The semiconductor memory apparatus according to claim 9, wherein the first data input section is deactivated in a first input/output mode, and aligns the inputted data and outputs the aligned data to the first data input/output line in a second input/output mode.

11. The semiconductor memory apparatus according to claim 10, wherein the second data input section aligns the inputted data and outputs the aligned data to one of the first and second data input/output lines based on the address signal in the first input/output mode, and aligns the inputted data and outputs the aligned data to the second data input/output line in the second input/output mode.

12. The semiconductor memory apparatus according to claim 9, wherein the first data input section comprises:
   a first data alignment circuit configured to align and output the inputted data; and
   a first input selection part configured to selectively output an output of the first data alignment circuit to the first data input/output line based on the input/output mode.

13. The semiconductor memory apparatus according to claim 12, wherein the second data input section comprises:
   a second data alignment circuit configured to align and output the inputted data; and
   a second input selection part configured to selectively output an output of the second data alignment circuit to one of the first and second data input/output lines based on the input/output mode and the address signal.

14. The semiconductor memory apparatus according to claim 9, wherein the first data input section aligns the inputted data inputted in series into parallel data and outputs the aligned parallel data to the first data input/output line.

15. The semiconductor memory apparatus according to claim 9, wherein the second data input section aligns the inputted data inputted in series into parallel data and outputs the aligned parallel data to one of the first and second data input/output lines.

16. The semiconductor memory apparatus according to claim 9, further comprising:
a data input buffer unit configured to buffer external data inputted through a pad and generate the inputted data.

* * * * *